United States Patent
Ohuchi et al.

(10) Patent No.: US 6,699,735 B2
(45) Date of Patent: *Mar. 2, 2004

(54) SEMICONDUCTOR DEVICE AND METHOD FOR MANUFACTURING THE SEMICONDUCTOR DEVICE

(75) Inventors: Shinji Ohuchi, Tokyo (JP); Yasuo Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/383,691

(22) Filed: Mar. 10, 2003

(65) Prior Publication Data

US 2003/0162328 A1 Aug. 28, 2003

Related U.S. Application Data

(62) Division of application No. 10/032,009, filed on Dec. 31, 2001, now Pat. No. 6,562,658, which is a division of application No. 09/478,211, filed on Jan. 5, 2000, now Pat. No. 6,353,267.

(30) Foreign Application Priority Data

Sep. 22, 1999 (JP) ............................................. 11-268925

(51) Int. Cl.[7] ................................................. H01L 21/44
(52) U.S. Cl. ........................ 438/113; 438/459; 438/460; 438/464
(58) Field of Search ................................. 438/113, 114, 438/459, 460, 462, 464, 465, 458

(56) References Cited

U.S. PATENT DOCUMENTS

| | | | | |
|---|---|---|---|---|
| 5,554,887 A | * | 10/1996 | Sawai et al. | 257/737 |
| 5,757,066 A | * | 5/1998 | Inoue et al. | 257/666 |
| 5,986,335 A | * | 11/1999 | Amagai | 257/668 |
| 6,093,958 A | * | 7/2000 | Inaba | 257/672 |
| 6,562,658 B2 | * | 5/2003 | Ohcuhi et al. | 438/113 |
| 2002/0050624 A1 | | 5/2002 | Vandeputte et al. | |

FOREIGN PATENT DOCUMENTS

| | | | | |
|---|---|---|---|---|
| JP | 08064725 | | 3/1996 | |
| JP | 08064725 A | * | 3/1996 | ........... H01L/23/28 |
| JP | 11-054564 | | 2/1999 | |
| JP | 11-121525 | | 4/1999 | |

* cited by examiner

*Primary Examiner*—Kevin M. Picardat
(74) *Attorney, Agent, or Firm*—Rabin & Berdo, P.C.

(57) ABSTRACT

A semiconductor device having resin formed on both surfaces of semiconductor elements, where a resin thickness ratio for the resin formed on the two surfaces at least 0.2 and not more than 1.

8 Claims, 4 Drawing Sheets

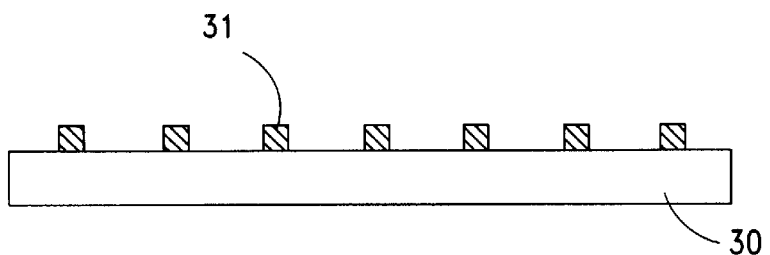
FIG. 3-A
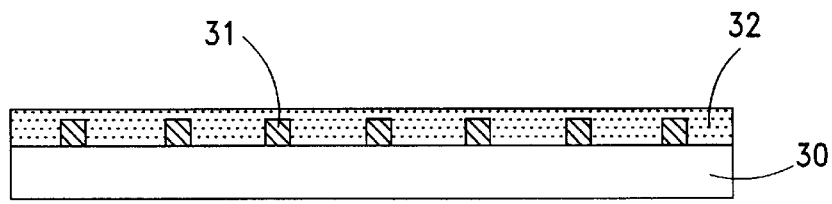
FIG. 3-B
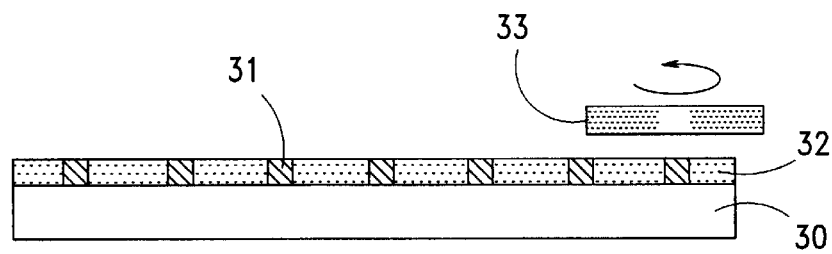
FIG. 3-C
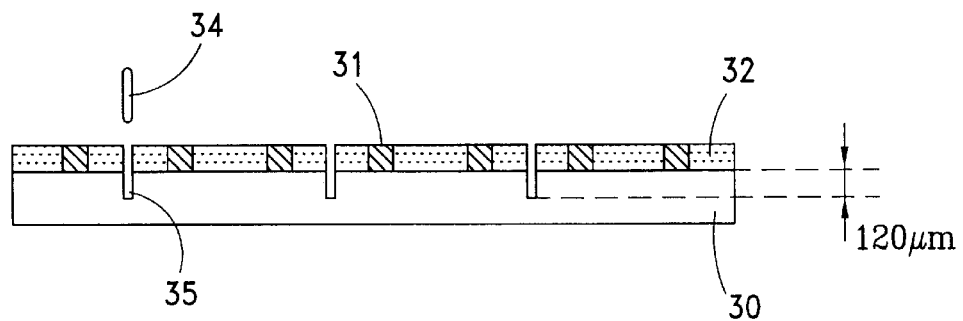
FIG. 3-D

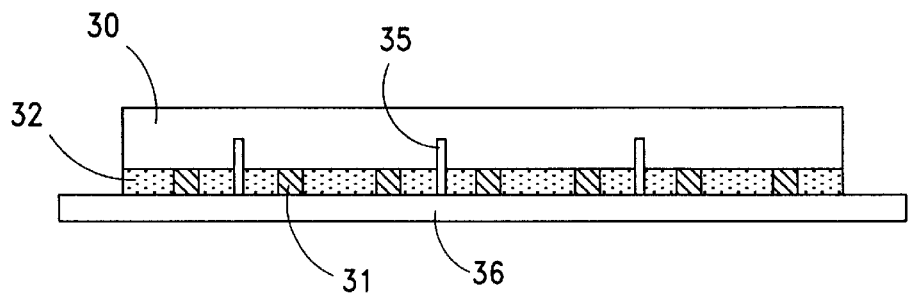
FIG. 4-A
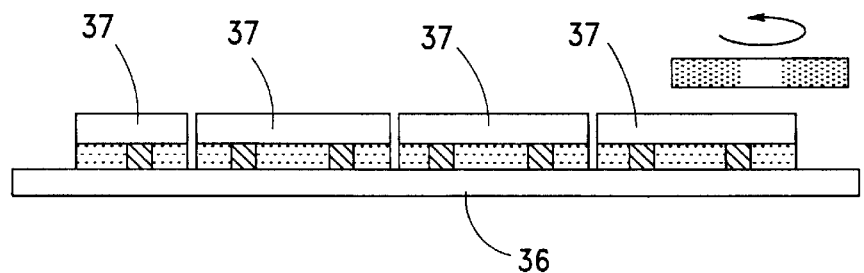
FIG. 4-B
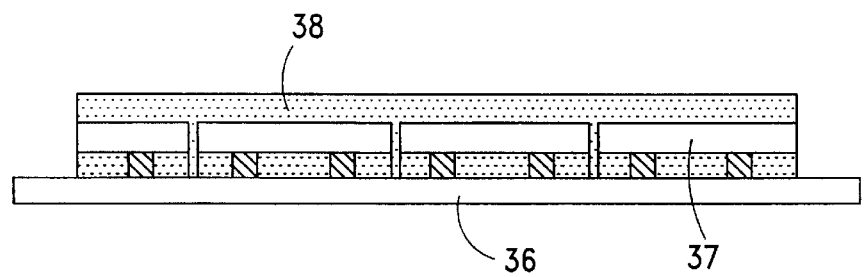
FIG. 4-C
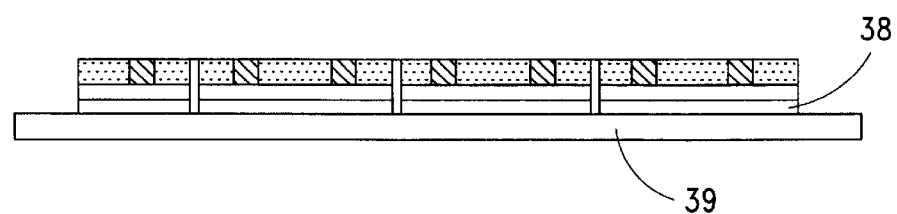
FIG. 4-D

SEMICONDUCTOR DEVICE AND METHOD FOR MANUFACTURING THE SEMICONDUCTOR DEVICE

This is a Divisional Application of prior application Ser. No. 10/032,009 filed on Dec. 31, 2002, now U.S. Pat. No. 6,562,658 which is a Divisional Application of prior application Ser. No. 09/478,211 filed on Jan. 5, 2000, now U.S. Pat. No. 6,353,267.

BACKGROUND OF THE INVENTION

1. Field of the Invention

The present invention relates to a semiconductor device and method for manufacturing the semiconductor device, and particularly to a package for the semiconductor device.

2. Description of the Related Art

High density mounting of semiconductor devices has been advancing in recent years, and the main focus has been on semiconductor devices such as chip size packages.

As an example of a chip size package structure semiconductor device, Japanese Patent Application Non. Hei 11-102599 discloses a semiconductor device having a semiconductor element thickness of less than 200 $\mu$m and a large ratio of resin compared to the semiconductor elements, in order to solve a problem where cracks arise at a joining section between the semiconductor device and a mounting substrate due to differences in the thermal expansion coefficients of the semiconductor elements and the mounting substrate.

Also, Japanese Patent laid open No. Hei. 8-64725 discloses a chip size package where sealing resin is formed on a circuit formation surface of a semiconductor element and a surface opposite the circuit formation surface, and warping of the wafer is prevented.

In a semiconductor device having the most recent chip size package structure as described above, in order to stop cracking at a junction section between the semiconductor element and the mounting substrate, the trend has been to make the thickness of the semiconductor element thin, and make a proportion of resin large compared to the semiconductor element.

However, if the thickness of the semiconductor element is made less than 200 $\mu$m and the ratio of the thickness of the semiconductor element to the thickness of the resin becomes small, in the case where resin is only formed on the circuit formation surface side of the semiconductor element, warping of the wafer occurs even for individual semiconductor elements obtained by dividing the wafer.

In the semiconductor device of Japanese Patent Laid-open No. Hei. 8-64725. There is also a problem of damage to the wafer at the time of conveying, when the thickness of the wafer is less than 200 $\mu$m, if resin sealing is carried out after grinding the rear surface of the semiconductor wafer.

SUMMARY OF THE INVENTION

The object of the present invention is to provide a chip size package structure semiconductor device having semiconductor elements of less than 200 $\mu$m in thickness, which can be favorably mounted in a mounted substrate.

Another object of the present invention is to provide a manufacturing method for a chip size package structure semiconductor device that has sealing resin formed on both surfaces of a semiconductor element, and particularly a method of manufacturing a thin semiconductor device in which the semiconductor element has a thickness of less than 200 $\mu$m.

In order to achieve the above described objects, a semiconductor device of the present invention comprises a semiconductor element with a thickness of less than 200 $\mu$m, a protruding electrode formed on a circuit formation surface of the semiconductor element, sealing resin, for sealing the circuit formation surface and the protruding electrode to cause an upper surface of the protruding electrode to be exposed, and sealing resin for sealing a surface of the semiconductor element opposite to the circuit formation surface, where if the thickness of the sealing resin for sealing the circuit formation surface of the semiconductor element is designated A and the thickness of the sealing resin for sealing the surface of the semiconductor element opposite to the circuit formation surface is designated B, the expression $0.2 \leq A/B \leq 1$, or $0.2 \leq B/A \leq 1$ is satisfied.

Various modifications are possible to the present invention, and will be understood by one skilled in the art with reference to the claims and embodiments contained herein.

BRIEF DESCRIPTION OF THE DRAWINGS

FIG. 3A is a drawing showing a method of manufacturing the semiconductor device of the first embodiment of the present invention.

FIG. 3B is a drawing showing a method of manufacturing the semiconductor device of the first embodiment of the present invention.

FIG. 3C is a drawing showing a method of manufacturing the semiconductor device of the first embodiment of the present invention.

FIG. 3D is a drawing showing a method of manufacturing the semiconductor device of the first embodiment of the present invention.

FIG. 4A is a drawing showing a method of manufacturing the semiconductor device of a second embodiment of the present invention.

FIG. 4B is a drawing showing a method of manufacturing the semiconductor device of the second embodiment of the present invention.

FIG. 4C is a drawing showing a method of manufacturing the semiconductor device of the second embodiment of the present invention.

FIG. 4D is a drawing showing a method of manufacturing the semiconductor device of the second embodiment of the present invention.

DESCRIPTION OF THE PREFERRED EMBODIMENTS

Figure 1:
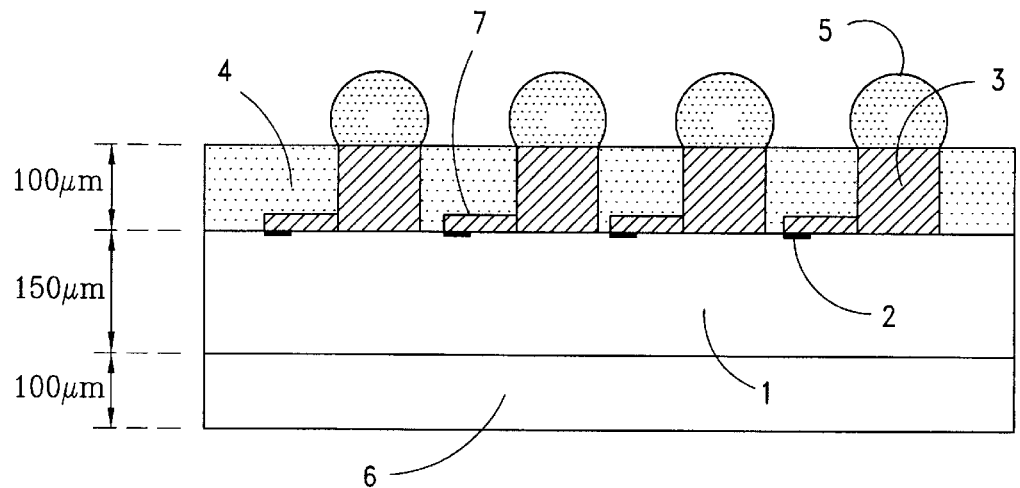
FIG. 1 is a drawing showing the structure of a semiconductor device of a first embodiment of the present invention.

FIG. 1 is a drawing showing the structure of a semiconductor device of a first embodiment of the present invention.

The first embodiment will be described using FIG. 1.

A semiconductor element 1 has a thickness of less than 200 $\mu$m, and is 150 $\mu$m in this case. Aluminum electrode pads 2 are formed at specified locations on a main surface (circuit formation surface) of the semiconductor element 1. Conductive protruding electrodes, for example copper posts 3, are also formed on the main surface of the semiconductor element 1. The height of the posts 3 is 100 µm. The posts 3 are connected to the aluminum electrode pads 2 via copper wiring 7.

The main surface of the semiconductor element 1 and the posts 3 are sealed with resin 4 so that the upper surfaces of the posts 3 are exposed. The thickness of the resin 4 is the same as that of the posts 3, namely 100 µm. Here, the resin 4 is formed to a thickness of 100 µm in order to relieve stress applied to the semiconductor element by the resin and to prevent scratching of the semiconductor element at the time of mounting the semiconductor device on a mounting substrate. Bump electrodes 5 are formed on the posts 3 exposed on the surface of the resin 4 using solder etc. A rear surface of the semiconductor element opposite to the main surface is sealed using resin, and the thickness of the resin 6 is the same as that of the resin 4, namely 100 µm.

Figure 7:
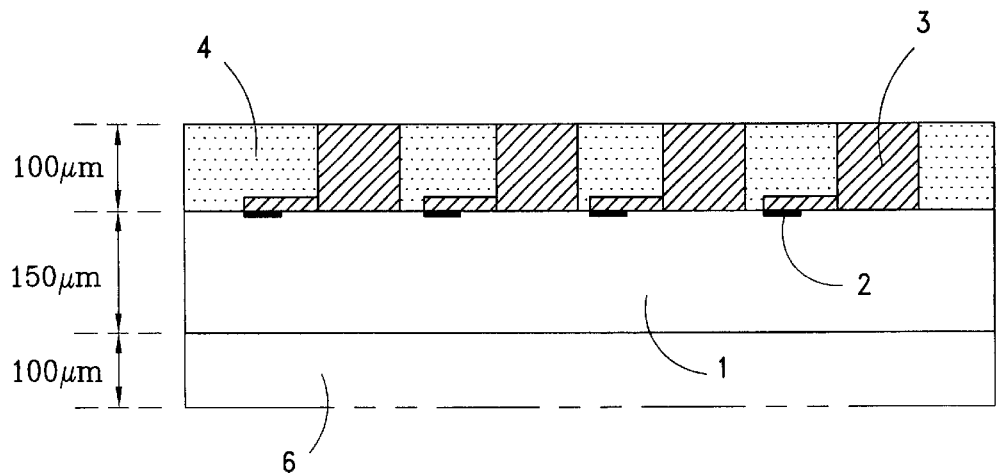
FIG. 7 is a drawing showing the structure of a semiconductor device of a second embodiment of the present invention.

FIG. 7 is a drawing showing the structure of a semiconductor device of a second embodiment of the present invention.

Structural elements that are the same as those in FIG. 1 have the same reference numerals attached thereto, and description will be omitted.

In FIG. 7, the thickness of the resin 4 is 100 µm and the thickness of the resin 6 is 100 µm.

Figure 2:
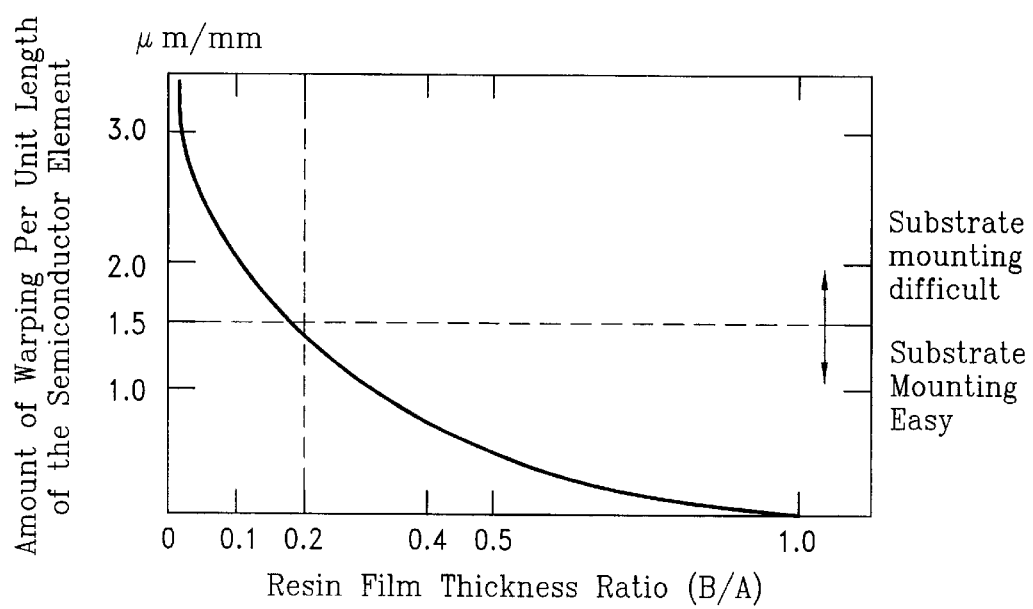
FIG. 2 is a graph showing an amount or warping of a semiconductor element.

FIG. 2 is a graph showing an amount of warping of a semiconductor element formed having sealing resin formed on both main and rear surfaces. The horizontal axis of FIG. 2 represents a resin film thickness ratio, for the resin on the main surface of the semiconductor element and the resin on the rear surface. The vertical axis in FIG. 2 represents the amount of warping per unit length of the semiconductor element.

In the graph of FIG. 2, the thickness of the semiconductor element is 150 µm, and when the resin thickness ratio is 1.0, the resin formed on the semiconductor element main surface side is 100 µm and the resin formed in the semiconductor element rear surface side is 0 µm. When the rear surface resin thickness gradually increases, when the resin thickness ratio is 1.0, the resin formed on the semiconductor element main surface side and the resin formed in the semiconductor element rear surface side have the same thickness.

Referring to FIG. 2, it will be understood that if there is a large difference in resin thickness between the resin on the semiconductor element main surface and the resin on the rear surface there will be significant warping of the semiconductor element.

If the resin thickness formed on the main surface of the semiconductor element is designated A, and the resin thickness on the rear surface is designated B, then the amount of warping when $0.2 \leq B/A \leq 1.0$ is smaller than 1.5 µm/mm. With this extent of warping, mounting the semiconductor devices on the mounting substrate is comparatively easy.

Still referring to FIG. 2, it will be understood that if B/A becomes less than 0.2 the amount of warping of the semiconductor element suddenly increases.

Here, if the warping of the semiconductor exceeds 1.5 µm/mm, then at the time the semiconductor device is mounted on the mounting substrate some of the bumps of the semiconductor device will no longer come into contact with the mounting substrate and it will not be possible to make good contact between the semiconductor device and the mounting substrate. Also, due to differences in the heights of the bumps from the mounting substrate differences will arise in the resistance of the connecting sections.

FIG. 3 and FIG. 4 show manufacturing methods for the semiconductor device of the first and second embodiments of the present invention.

The method of manufacturing the semiconductor device of the first embodiment will now be described using FIG. 3 and FIG. 4.

First of all, Cu posts 31 having a height of approximately 100 µm are formed on the main surface (circuit formation surface) of a semiconductor wafer 30 by electroplating or the like (FIG. 3A). These posts 31 are electrically connected to electrode pads (not shown) formed on the wafer 30.

After that, resin 32 is filled in so as to seal the main surface of the semiconductor wafer 30 and the posts 31 (FIG. 3B). The method of filling in the resin is a transfer mold method, potting method, or printing method, etc.

The semiconductor wafer 30 at this stage has a sufficient thickness so that there is no warping due to stress etc. of the resin 32.

Next, upper surfaces of the posts 31 embedded in the resin 32 are exposed, and the surface of the resin 32 is ground using a grinding tool 33 until the height of the resin 32 and the posts 31 is 100 µm (FIG. 3C).

Following that, grooves 35 are formed from the filled surface of the resin 32 by a peripheral cutting edge 34 rotating at high speed. These grooves, shown in FIG. 3D, form sections for dividing into individual semiconductor devices later.

The depth of these groove 35 is determined as described in the following. In this embodiment, the thickness of the semiconductor element is made 150 µm, and so grooves of at least 150 µm are formed in parts of the semiconductor wafer 30. In this embodiment groove of 200 µm are formed in parts of the semiconductor wafer 30. The depth of the grooves 35 formed at this stage from the surface of the resin to a bottom section is the resin thickness + the depth of the groove in the wafer, that is 100+200=300 µm (FIG. 3D).

After that, grinding tape 36 is stuck to the resin formation surface of the substrate. The adhesive force of this grinding tape is reduced by exposure to ultraviolet rays and can be easily peeled off.

The grinding tape 36 is fixed to a grinding platform (not shown) (FIG. 4A). The whole of the rear surface side of the wafer 30 is ground with the grinding tape fixed to the grinding platform. This grinding is carried out so as to pass the bottom of the grooves 35 formed at the previous stage until the thickness of the wafer 30 becomes 150 µm.

By grinding the rear surface of the wafer 30 beyond the bottom of the grooves the semiconductor wafer is divided into individual devices. In other words, individually divided semiconductor elements 37 are now arrayed on the grinding tape 36 (FIG. 4B).

Resin 38 is also formed on the rear surface of the semiconductor element. The method of forming the resin is a transfer mold method, a potting method, or printing method or else a method of pasting on epoxy resin such as tape shaped polyimide resin (FIG. 4C).

The grinding tape used in this embodiment can be made to disappear at a curing temperature after sealing.

Figure 5:
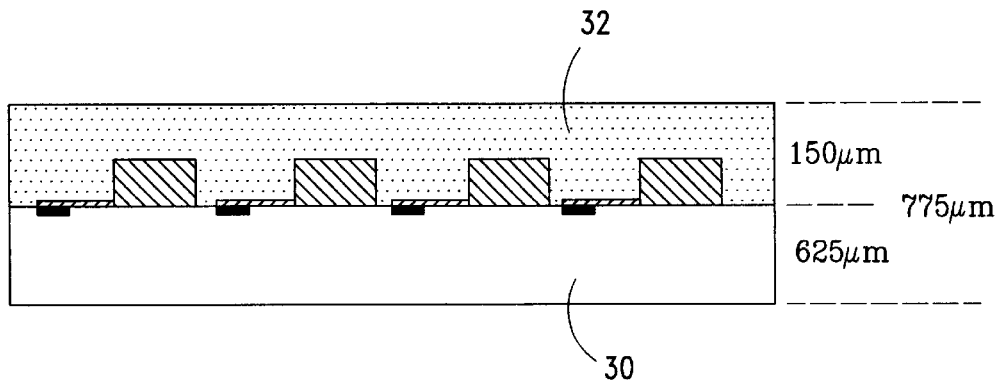
FIG. 5 is a drawing showing the structure of a semiconductor device at the time of resin sealing a main surface.
Figure 6:
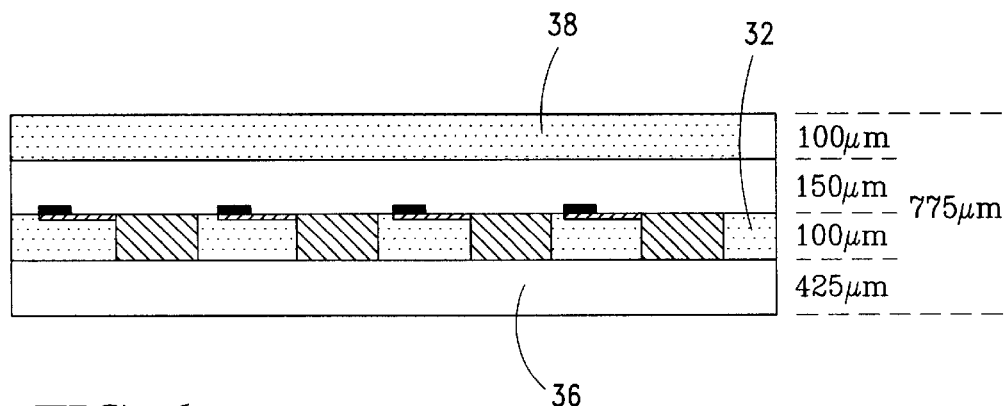
FIG. 6 is a drawing showing the structure of a semiconductor device at the time of resin sealing a rear surface.

Also, by making the total thickness of the semiconductor element and the resin 32 of the main surface side 32 at the time of resin sealing of the circuit formation surface side, as shown in FIG. 5, the same as the total thickness of the semiconductor element, main surface side resin 32, rear surface side resin 38 and the grinding tape 36 at the time of resin sealing the semiconductor element rear surface side, as shown in FIG. 6, then it is possible to carry out sealing using the same sealing mold and the same sealing conditions when the resin 32 and the resin 38 are formed using a transfer mold method.

After that, mounting tape is pasted onto the resin 38, and after the grinding tape has been removed sections of the resin 39 corresponding to the grooves 35 are scribed using a peripheral cutting edge rotating at high speed (FIG. 4D).

Following that, the device is supplied to finish processing.

In the finish processing, bump electrodes etc. are formed on the posts 31, as required.

In this embodiment, a sufficiently thick wafer is first of all sealed with resin. At this stage, there is no danger of warping of the wafer. After that, grooves are formed in the wafer from the resin side. By grinding the entire rear surface of the wafer beyond the bottom of the grooves, the wafer is separated into individual parts. Accordingly, the wafer is divided into individual semiconductor elements by grinding, which removes the problem of damage to the semiconductor wafer caused by conveying a thin semiconductor wafer on which resin is not formed. As a result of this, with the manufacturing method of the present invention it is possible to provide semiconductor devices with thinner semiconductor elements than in the related art.

Even if the semiconductor elements are finally thin, resin is also formed on the rear surface of the semiconductor elements, which means that even in the case of mounting the semiconductor device on a mounting substrate there is no warping of the semiconductor device and favorable mounting can be carried out.

What is claimed is:

1. A method for manufacturing a semiconductor device, comprising:

providing a semiconductor wafer having a main surface, including a plurality of semiconductor chip regions formed in the wafer main surface, wherein integrated circuits are respectively formed in the semiconductor chip regions;

forming a plurality of electrodes on the wafer main surface, wherein the electrodes are respectively connected to the integrated circuits;

forming a first resin layer on the wafer main surface;

exposing upper surfaces of the electrodes through the first resin layer;

forming a second resin layer on a wafer back surface opposite the wafer main surface, so as to satisfy a relation $0.2 \leq y/x < 1$, where x denotes a thickness of the first resin layer and y denotes a thickness of the second resin layer; and dividing the semiconductor wafer into a plurality of separated semiconductor chips, wherein each semiconductor chip corresponds to one of the semiconductor chip regions.

2. The method according to claim 1, wherein said step of exposing includes polishing a surface of the first resin layer until the electrode upper surfaces are exposed.

3. The semiconductor device according to claim 2, wherein after said polishing, the first resin layer has a thickness less than 100 $\mu$m.

4. The semiconductor device according to claim 1, wherein after said step of exposing, the first resin layer has a thickness less than 100 $\mu$m.

5. The method according to claim 1, wherein said step of forming a first resin layer includes forming the first resin layer such that the electrode upper surfaces are embedded therein.

6. A method according to claim 1, wherein said step of dividing includes, prior to said step of forming a second resin layer, forming grooves reaching from the surface of the first resin layer 32 to a specified depth of the wafer;

pasting tape onto the surface of the first resin layer; and grinding the wafer back surface with the tape pasted to the surface of the first resin layer, until the semiconductor wafer is separated into the plurality of semiconductor chips; and wherein said step of forming the second resin layer is performed, on the ground surfaces of the separated semiconductor chips with the tape remaining pasted to the surface of the first resin layer;

further comprising the step of scribing the second resin layer to form individual semiconductor devices.

7. A method according to claim 6, wherein the steps of forming the first and second resin layers each includes use of a same mold.

8. A method according to claim 1, wherein the steps of forming the first and second resin layers each includes use of a same mold.

* * * * *